United States Patent
Bernstein et al.

(10) Patent No.: US 6,882,015 B2
(45) Date of Patent: Apr. 19, 2005

(54) INTRALEVEL DECOUPLING CAPACITOR, METHOD OF MANUFACTURE AND TESTING CIRCUIT OF THE SAME

(75) Inventors: Kerry Bernstein, Underhill, VT (US); John A. Bracchitta, South Burlington, VT (US); William J. Cote, Poughkeepsie, NY (US); Tak H. Ning, Yorktown Heights, NY (US); Wilbur D. Pricer, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/660,755

(22) Filed: Sep. 12, 2003

(65) Prior Publication Data

US 2004/0046230 A1 Mar. 11, 2004

Related U.S. Application Data

(62) Division of application No. 09/330,803, filed on Jun. 11, 1999, now Pat. No. 6,677,637.

(51) Int. Cl.$^7$ ............................................... H01L 29/76
(52) U.S. Cl. ...................... 257/379; 257/381; 324/522; 361/275.1
(58) Field of Search ........................ 361/275.1; 257/379, 257/381; 324/522

(56) References Cited

U.S. PATENT DOCUMENTS

| | | | |
|---|---|---|---|
| 3,268,809 A | | 8/1966 | Meyer et al. |
| 3,287,635 A | | 11/1966 | Mole |
| 3,414,792 A | | 12/1968 | Mui et al. |
| 3,764,938 A | | 10/1973 | Barnes |
| 3,805,198 A | | 4/1974 | Gewartowski et al. |
| 3,962,713 A | | 6/1976 | Kendall et al. |
| 4,063,160 A | * | 12/1977 | Lanz et al. ................. 324/535 |
| 4,063,162 A | * | 12/1977 | Lanz et al. ................. 324/535 |
| 4,063,165 A | * | 12/1977 | Lanz ........................... 324/535 |
| 4,166,257 A | | 8/1979 | Subramanian |
| 4,274,124 A | * | 6/1981 | Feinberg et al. .......... 361/275.1 |
| 4,401,942 A | | 8/1983 | Renz |
| 4,409,608 A | | 10/1983 | Yoder |
| 4,425,541 A | | 1/1984 | Burkum et al. |
| 4,434,401 A | | 2/1984 | York |
| 4,464,621 A | * | 8/1984 | Prigent et al. ............... 324/522 |
| 4,536,704 A | | 8/1985 | Burkum et al. |
| 4,543,594 A | | 9/1985 | Mohsen et al. |
| 4,571,543 A | | 2/1986 | Raymond et al. |
| 4,805,063 A | | 2/1989 | Kataoka et al. |
| 4,931,721 A | | 6/1990 | Berigan et al. |
| 4,937,649 A | | 6/1990 | Shiba et al. |
| 5,101,106 A | | 3/1992 | Cox, Jr. et al. |
| 5,208,725 A | | 5/1993 | Akcasu |
| 5,246,884 A | | 9/1993 | Jaso et al. |

(Continued)

OTHER PUBLICATIONS

"Decoupling Circuit Structure to Reduce Electrical Noise", IBM Technical Disclosure Bulletin, vol. 37, No. 9, Sep. 1994.

(Continued)

*Primary Examiner*—George Fourson
*Assistant Examiner*—Joannie Adelle Garcia
(74) *Attorney, Agent, or Firm*—Anthony J. Canale; McGinn & Gibb, PLLC

(57) ABSTRACT

A decoupling capacitor is provided for a semiconductor device and may include a first low dielectric insulator layer and a low resistance conductor formed into at least two interdigitized patterns on the surface of the first low dielectric insulator in a single interconnect plane. A high dielectric constant material may be provided between the two patterns. A circuit for testing a plurality of these capacitors is also provided which includes a charge monitoring circuit, a coupling circuit and a control circuit.

16 Claims, 8 Drawing Sheets

U.S. PATENT DOCUMENTS

| | | |
|---|---|---|
| 5,357,225 A | 10/1994 | Mortensen |
| 5,394,294 A | 2/1995 | Mei et al. |
| 5,446,310 A * | 8/1995 | Baliga et al. ............... 257/529 |
| 5,449,948 A | 9/1995 | Inoue et al. |
| 5,459,633 A | 10/1995 | Kosslowski et al. |
| 5,576,240 A | 11/1996 | Radosevich et al. |
| 5,583,359 A | 12/1996 | Ng et al. |
| 5,939,766 A | 8/1999 | Stolmeijer et al. |
| 6,045,716 A | 4/2000 | Walsh et al. |
| 6,069,069 A | 5/2000 | Chool et al. |
| 6,258,712 B1 | 7/2001 | Wang |
| 6,307,250 B1 * | 10/2001 | Krauter et al. ............... 257/532 |

OTHER PUBLICATIONS

"Limiting the Short–Circuit Current in Defective Integrated Decoupling Capacitors", IBM Technical Disclosure Bulletin, Vo. 33, No. 6B, Nov. 1990.

* cited by examiner

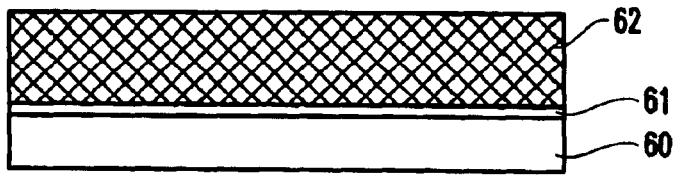

FIG. 15

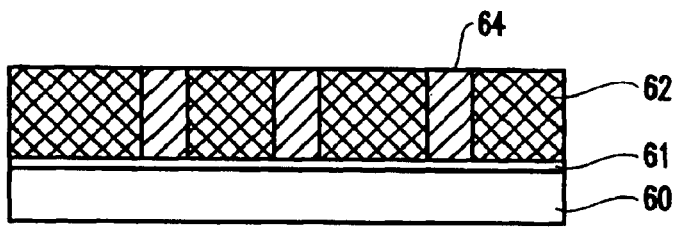

FIG. 16

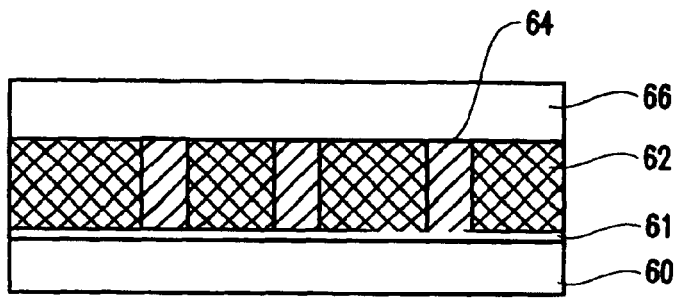

FIG. 17

```
┌─────────────────────────────────────────┐
│ APPLY ETCH STOP LAYER 61 TO TOP OF LOW  │─S222
│ DIELECTRIC INSULATOR 60.                │
└─────────────────────────────────────────┘
                    ↓
┌─────────────────────────────────────────┐
│ DEPOSIT HIGH DIELECTRIC MATERIAL 62 ON  │─S224
│ ETCH STOP LAYER 61.                     │
└─────────────────────────────────────────┘
                    ↓
┌─────────────────────────────────────────┐
│ ETCH TROUGHS 64 IN THE HIGH DIELECTRIC  │
│ MATERIAL 62, STOPPING ON THE ETCH STOP  │─S226
│ LAYER. REMOVE ETCH STOP LAYER 61.       │
└─────────────────────────────────────────┘
                    ↓
┌─────────────────────────────────────────┐
│ FILL TROUGHS WITH METAL USING TYPICAL   │─S228
│ DAMASCENE PROCESSING.                   │
└─────────────────────────────────────────┘
                    ↓
┌─────────────────────────────────────────┐
│ DEPOSIT LOW DIELECTRIC CONSTANT MATERIAL│─S230
│ 66 FOR THE NEXT WIRING LEVEL.           │
└─────────────────────────────────────────┘
```

FIG. 18

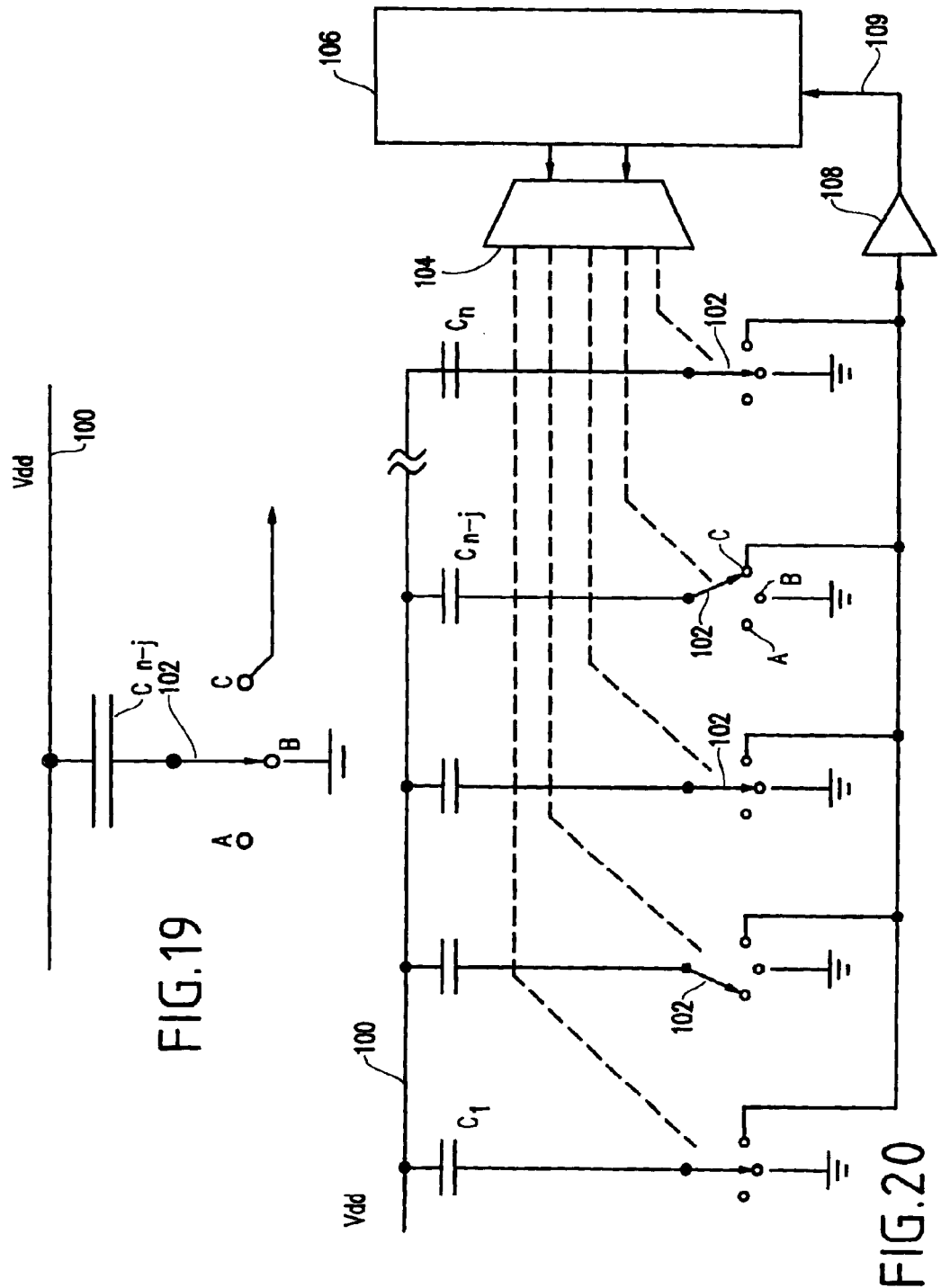

INTRALEVEL DECOUPLING CAPACITOR, METHOD OF MANUFACTURE AND TESTING CIRCUIT OF THE SAME

The present Application is a Divisional Application of U.S. patent application Ser. No. 09/330,803, filed on Jun. 11, 1999 now U.S. Pat. No. 6,677,637.

BACKGROUND OF THE INVENTION

1. Field of the Invention

The present invention generally relates to decoupling capacitors and more particularly to testing such capacitors having high dielectric material between the metal wirings of the capacitor.

2. Description of the Related Art

Conventional microprocessor clock rates are approaching the gigahertz range of operation and thereby create noise problems. As a result, large decoupling capacitors are used between a power supply and ground to provide enough noise immunity for proper circuit operation. Options include the integration of large plate capacitors, which would essentially occupy the entire chip above the active silicon surface, and trench capacitors embedded in the silicon substrate. However, large plate capacitors add significant critical area and thereby create a difficult yield problem. On the other hand, trench capacitors require extra silicon area which increases the chip size. Both solutions add significant process complexity and cost.

SUMMARY OF THE INVENTION

In view of the foregoing and other problems of the conventional methods, it is, therefore, an object of the present invention to provide a decoupling capacitor for a semiconductor device. The decoupling capacitor may include a first low dielectric insulator layer such as fluorinated glass. The capacitor may also include a low resistance conductor formed into at least two interdigitized patterns on the surface of the low dielectric insulator layer such as fluorinated glass. Each of the two patterns may be adjacent to the other such that their sidewalls form plates of the capacitor. The capacitor may also include a high dielectric constant material provided between the two interdigitized patterns.

The high dielectric constant material may comprise tantalum pentoxide or silicon nitride. The capacitor may also include a second low dielectric insulator layer provided on the high dielectric constant material and the patterns. Even further, the capacitor may include a polish stop material provided on each of the two patterns. The polish stop, which may be non-conformally deposited on the interdigitized patterns, may include diamond-like carbon or silicon nitride.

Another object of the present invention is to provide a circuit for monitoring a plurality of capacitors. The circuit may include a charge monitoring circuit coupled to each capacitor segment and a coupling circuit for selectively coupling and decoupling one of the capacitor segments from among a plurality of states. A control circuit may also be provided for sequentially controlling the coupling circuit of each of the capacitor segments so as to disconnect a failed capacitor segment while the other capacitor segments are monitored.

The control circuit may include at least one n-channel transistor connected between the control circuit and one plate of the capacitor segment. The control circuit may further include a fuse circuit provided between the capacitor segment and the at least one n-channel transistor.

The coupling circuit may include at least one p-channel transistor connected between the control circuit and one plate of the capacitor segment. The other plate of the capacitor segment may be connected to a ground potential.

The coupling circuit may further include a fuse circuit connected between the control circuit and the p-channel transistor. A charge monitoring circuit may output a signal based on the amount of current flowing through the capacitor segment when the coupling segment is in a test state. The charge monitoring circuit may include an integrator circuit.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein:

FIGS. 15–17 illustrate a fourth process for forming a decoupling capacitor according to the present invention;

FIG. 18 shows a flowchart of the fourth process of manufacturing a decoupling capacitor according to the present invention;

FIG. 19 shows a circuit for testing a capacitor structure according to the present invention;

FIG. 20 shows a circuit for testing a plurality of capacitor structures according to the present invention;

DETAILED DESCRIPTION OF PREFERRED EMBODIMENTS OF THE INVENTION

Figure 1:
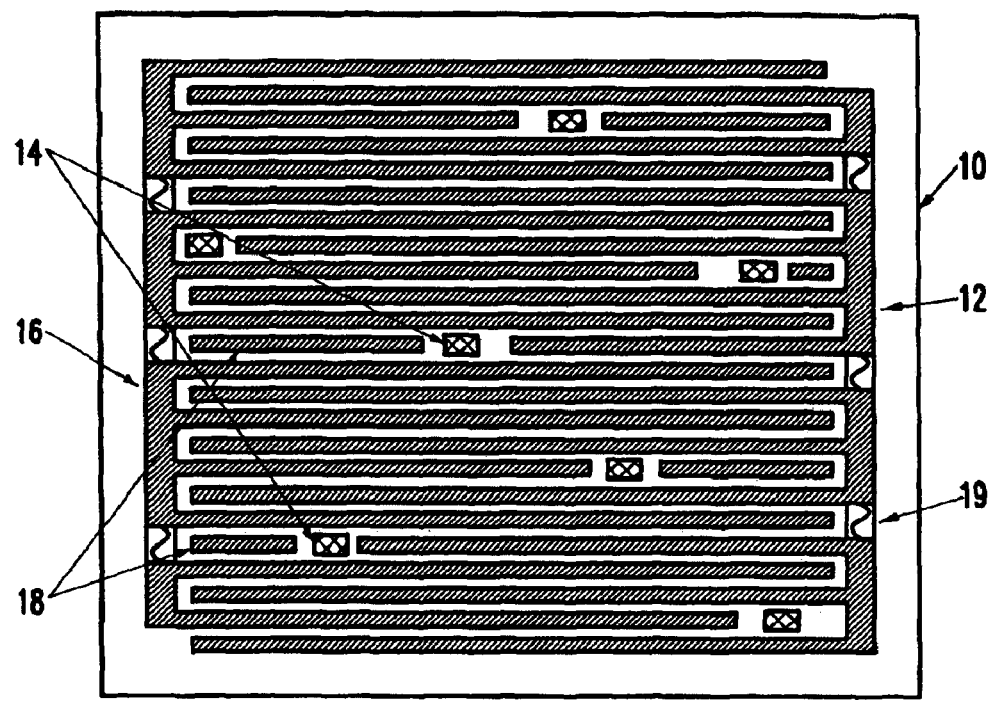
FIG. 1 illustrates a metal comb capacitor structure.

FIG. 1 illustrates a parallel plate capacitor structure. The finger capacitor may include interdigitized comb structures 12, 16 at a small (minimum) pitch constructed on a single wiring level. The comb structures 12, 16 occupy essentially the entire chip area 10 on a metal level above the active silicon surface. As is known in the art, ground comb 12 is connected to ground and power ($V_{dd}$) comb 16 is connected to a power supply. Passthrough vias 14 may be provided for connections between upper and lower levels as is well known in the art. A pattern fill 18 may also be used following a break in the finger and the via 14 associated with that break.

This capacitor structure is preferably fabricated above the last wiring level so as to simplify the layout since the number of required passthrough vias 14 will be relatively small. The metal thickness and layout rules for this metal level may be the same as the minimum pitch wiring level. The capacitor structure may also utilize fuse links 19 to allow for the sensing of anomalous current levels and on segments of the comb structure 12 and 16, and means for disconnecting those sections from power supplies to decrease the sensitivity of yield to the large amount of critical area added to the die.

Figure 2:
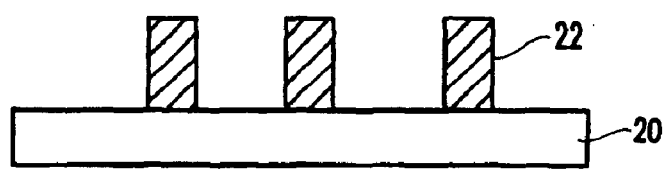
FIGS. 2–5 illustrate a first process for forming a decoupling capacitor according to the present invention.
Figure 3:
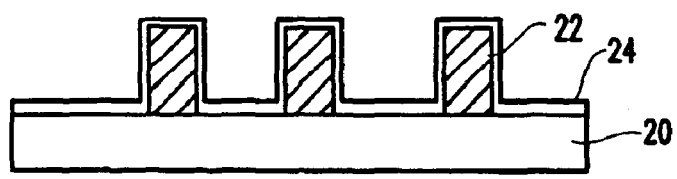
Figure 6:
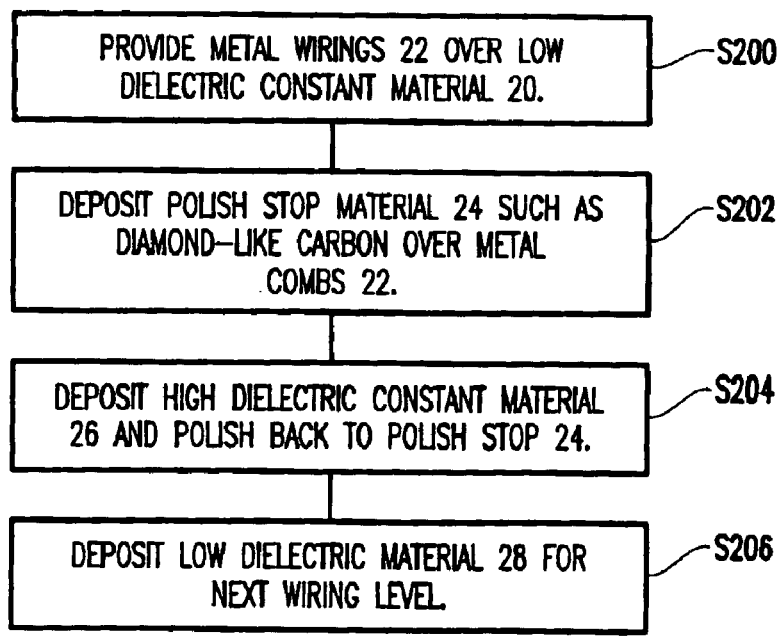
FIG. 6 shows a flowchart of the first process of manufacturing a decoupling capacitor according to the present invention.

Several processes are disclosed hereinafter to integrate high capacity comb structures into back end of line (BEOL) processing. More particularly, FIGS. 2–5 show one embodiment of forming a capacitor structure according to the present invention and FIG. 6 shows a flowchart of several steps of this method. FIG. 2 shows a low dielectric constant (insulator) material 20 such as fluorinated glass, HSQ, aerogel or silk, which is initially provided in a well known manner. In step S200, metal wirings 22 are provided over the low dielectric constant material 20 in a well known manner. Then, in step S202, a polish stop material 24 such as a thin layer of diamond-like carbon is non-conformally deposited using sputter deposition over the metal wirings 22 and over the upper surface of the low dielectric constant material 20. The amount of diamond-like carbon on the sidewalls of the wires 22 is minimized because of its low dielectric constant.

Figure 4:
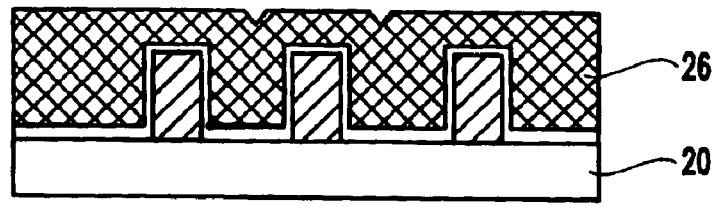
Figure 5:
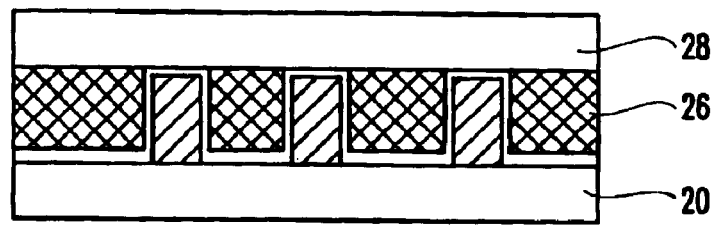

In step S204 and as shown in FIG. 4, a high dielectric material 26, such as tantalum pentoxide or silicon nitride, is deposited over the polish stop 24 to a height greater than the metal wiring 22. However, because of the consistent dense fill pattern of the metal wirings 22, the thickness of the high dielectric material 26 should be kept to a minimum to ensure gap fill and simplify the planarization process. For example, if the metal wirings 22 are 0.5 μm tall and have a 0.25/0.25 μm line width/line space, then a dense fill pattern allows the high dielectric material 26 to be as little as 0.25 μm thick theoretically, but more practically in the range of 0.3 μm. Without the fill pattern, the high dielectric material 26 should be greater than 0.5 μm thick. The high dielectric material 26 is preferably chemical-mechanical polished down to the polish stop 24 on top of the metal wirings 22. In step S206, the next low dielectric constant material (or insulator layer) 28 is deposited on the high dielectric material 26 for the next wiring level.

Figure 7:
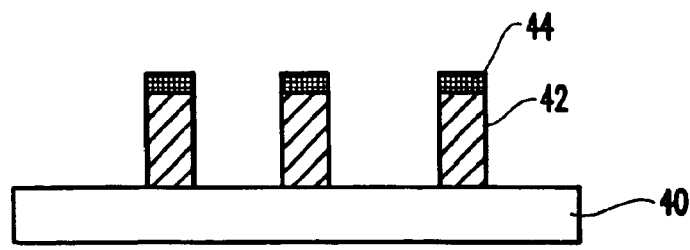
FIGS. 7–9 illustrate a second process for forming a decoupling capacitor according to the present invention.
Figure 8:
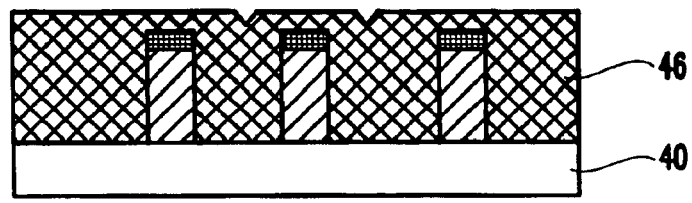
Figure 9:
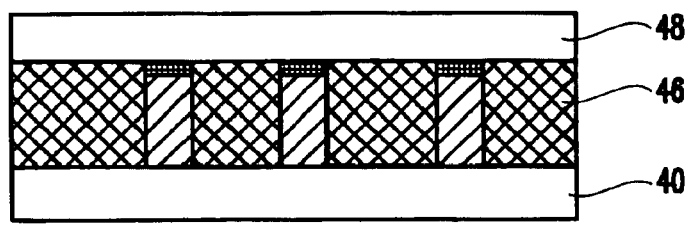
Figure 10:
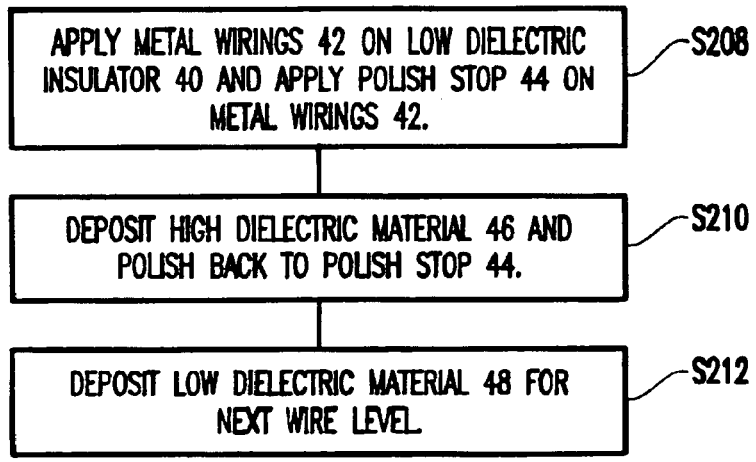
FIG. 10 shows a flowchart of the second process of manufacturing a decoupling capacitor according to the present invention.

FIGS. 7–9 show another embodiment of forming a capacitor structure according to the present invention and FIG. 10 shows a flowchart of several steps of this method. In step S208, the, metal wirings 42 are applied over the low dielectric (insulator) material 40. A polish stop 44, preferably made of silicon nitride, may be blanket deposited on top of the metal wiring 42 prior to lithographically defining and etching the metal wirings 42. In step S210, the high dielectric material 46 may be deposited and chemical-mechanical polished down to the polish stop 44. The thickness of the polish stop 44 should be thick enough to withstand the polishing. However, because of the consistent dense pattern density, corner erosion may not be a major concern and thus a polish stop 44 having a 50–80 nm thickness on top of the metal wiring 42 should be sufficient. Extra nitride on top of the line may make filling the gap between metal wirings 42 slightly more difficult. Then, in step S212, the low dielectric material 48 is deposited for the next wiring level.

Figure 11:
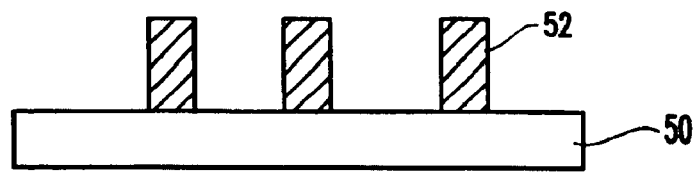
FIGS. 11–13 illustrate a third process for forming a decoupling capacitor according to the present invention.
Figure 12:
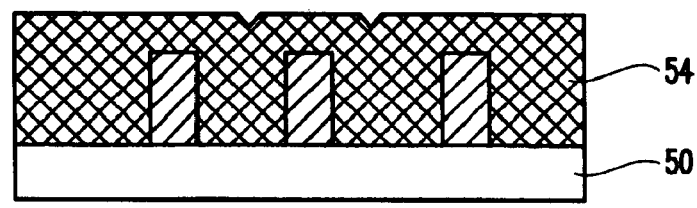
Figure 13:
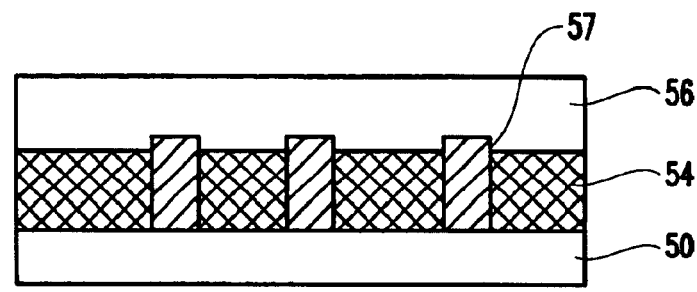
Figure 14:
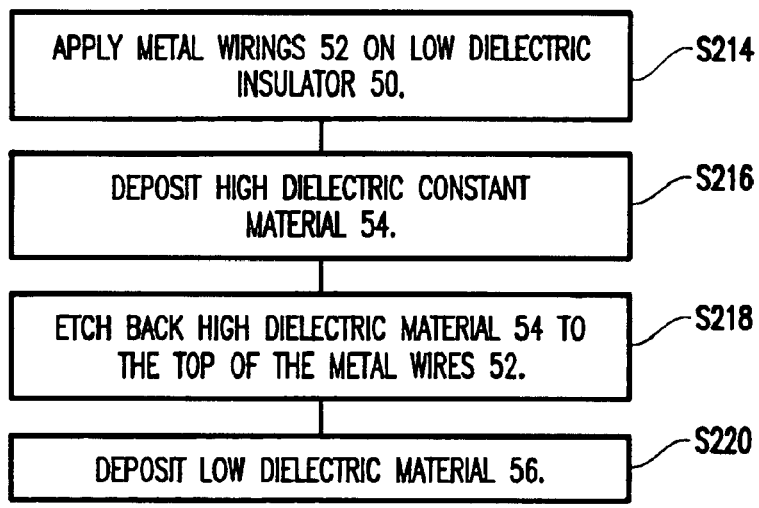
FIG. 14 shows a flowchart of the third process of manufacturing a decoupling capacitor according to the present invention.

FIGS. 11–13 show yet another embodiment of forming the capacitor structure according to the present invention and FIG. 14 shows a flowchart of several steps of this method. This embodiment is similar to the previously described embodiments and also includes an etch back process. In particular, in step S214, metal wirings 52 are applied on the low dielectric (insulator) material 50. In step S216, the high dielectric material 54 is applied over the metal wirings 52 and the low dielectric insulator 50. The high dielectric material 54 is chemically etched back in step S218 to the top of the metal wirings 52. Again, the pattern density may help to make the process more robust since the amount of material that must be removed, from the top of the metal is consistent. The etch back process may result in a step 57 between the high dielectric material 54 and metal wiring 52. This step 57 may require a chemical-mechanical polish touch up step prior to depositing the low dielectric material 56 in step S220.

FIGS. 15–17 show yet another embodiment of forming the capacitor structure according to the present invention and FIG. 18 shows a flowchart of several steps of this method. In contrast to the previous embodiments, this embodiment uses a damascene back end of line process. A low dielectric (insulator) material 60, such as fluorinated oxide, HSQ or silk, is initially deposited and may be either planarized or assumed planar. Then, in step S222, an etch stop layer 61 such as a diamond-like carbon (DLC) is deposited on the low dielectric material 60. Diamond-like carbon may be solely used as the low dielectric insulator or it may be used as the starting low dielectric insulator, thus removing the need for the etch stop layer 61. Then, in step S222, a high dielectric (insulator) material 62, such as tantalum pentoxide and/or silicon nitride, may be deposited on top of the diamond-like carbon as shown in FIG. 15.

Subsequently, in step S224, troughs 64 for the metal wiring may be lithographically defined and anisotropically etched into the high dielectric material 62 preferably made of tantalum pentoxide. A fluorine etch, such as $C_2F_6$, may be preferably used for the troughs 64. Hydrogen may be added during the last 20–30% of the etch, thus making it highly selective to etch the diamond-like carbon. In step S228, metal is deposited in the troughs 64 using typical damascene processing and the metal is planarized. A low dieletric insulator material 66 is deposited for the next wiring level in step S230.

In summary, the invention allows the ability to add decoupling capacitance without requiring pre-placement of the capacitors in silicon. It can also add decoupling capacitance without impacting front-end-of-line device density. Further, while using this invention, one can eliminate the requirement of anticipating where decoupling capacitance will be needed in the silicon. Further, conventional existing process steps may be used to achieve superior capacitance density. Wire profiles can also be optimized for both decoupling and signal conduction, via use of high dielectric constant material and low dielectric constant material. The invention may also be used for tunable capacitance, whereby incremental numbers of interleaved fingers are either present or receive high dielectric constant material, which is useful in analog, impedance matching scenarios. It may also be used for building decoupling capacitance right into $V_{dd}$ and GROUND power supply distribution schemes.

FIG. 19 shows a test circuit according to the present invention for testing decoupling capacitor structures such that as those described above. For example, FIG. 19 shows a capacitor $C_{n-j}$ which has one plate connected to a power supply potential line 100 and the other plate connected to a switch 102. In a preferred embodiment, switch 102 is operable between three states, namely, state A, state B and state C. State A represents a disabled state in which the capacitor will not operate. State B is connected to GROUND thereby connecting one comb 12 to GROUND. This state represents the capacitor being used under normal operation. Finally, state C is a connection to a test circuit which will be described below. This state is used to test each of the capacitor structures.

FIG. 20 shows a test circuit similar to that of FIG. 19 that is connected in parallel to a plurality of capacitors, such as $C_n$, $C_{n-j}$, ..., $C_1$. Each of the respective capacitors $C_n$, $C_{n-j}$, ..., $C_1$ is separately connected across one of the switches 102 so as to be separately tested. In the FIG. 20 embodiment, switch 102 corresponding to capacitor $C_{n-j}$, is in the testing position (i.e., state C). Capacitor $C_{n-j}$ is therefore the current capacitor being tested (hereafter the capacitor under test). The switch 102 connects the capacitor under test to the test circuit such as an integrator circuit comprised of the capacitor under test and comparator circuit 108 which outputs a value based on an internal threshold. The output signal is then applied across line 109 to a control circuit 106. In other words, if the capacitor under test is leaky, then the voltage input to the comparator circuit 108 will slowly drift and eventually trip the threshold of the comparator circuit 108.

The control circuit 106 operates with select circuit 104 to selectively couple and decouple each of the respective capacitors using the respective switches 102. In a preferred embodiment, the control circuit 106 monitors the voltage on the test line for approximately a millisecond. If the control circuit 106 discovers a defective capacitor, then the respective switch 102 will be placed in a DISABLE state (i.e., state A).

Figure 21:
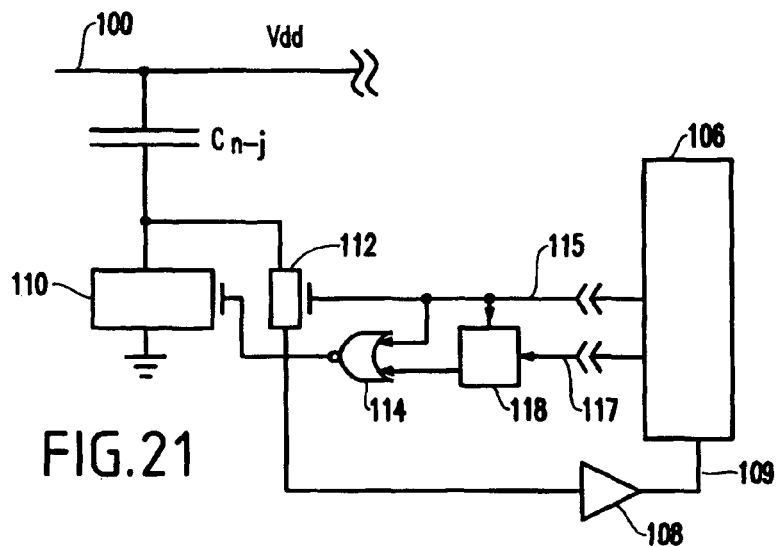
FIG. 21 shows an embodiment of a circuit for testing a capacitor structure according to the present invention.

FIG. 21 shows a preferred testing circuit. For ease of illustration, only capacitor $C_{n-j}$ is shown, although it is understood that this circuit is combined with other component parts to form the overall testing (or monitoring) circuit for a plurality of capacitors such as shown in the FIG. 20 embodiment.

One of the plates of the capacitor $C_{n-j}$ is connected to a power supply potential ($V_{dd}$) line 100. The other plate is connected to n-channel field effect transistor (FET) 110. The n-channel FET 112 is also connected to the capacitor $C_{n-j}$. The two FETs 110 and 112 act as a switch to disable the capacitor, connect the capacitor to GROUND or connect the capacitor to a test line as discussed above with respect to FIG. 20. When the capacitor $C_{n-j}$ is placed in the test state using the transistors 110, 112, then current flows from the power supply potential line 100, through the capacitor $C_{n-j}$, through the transistor 112 and to the integrator/comparator circuit 108. The control circuit 106 determines whether the capacitor $C_{n-j}$ is operating correctly based on the binary output of the integrator/comparator circuit 108. If the capacitor is not operating correctly, then a signal is output on line 117 to a fuse circuit 118, which operates to disconnect (i.e., blow) the capacitor. The fuse circuit 118 may also be replaced by a flip-flop circuit to operate in a similar way as would be understood by one skilled in the art. A NOR gate 114 is connected to the fuse circuit 118 and to the control circuit 106 along line 115. The output of the NOR gate 114 controls transistor 110 to control the switching operation. Accordingly, when the fuse circuit 118 disconnects, then the NOR gate forbids the transistor 110 from allowing the capacitor to operate normally.

Figure 22:
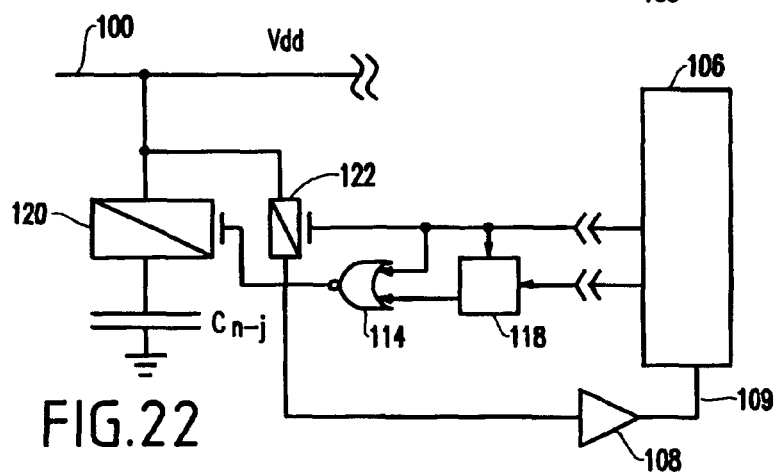
FIG. 22 shows another embodiment of a circuit for testing a capacitor structure according to the present invention.

FIG. 22 shows another embodiment of the test circuit which is similar to the FIG. 21 embodiment except that p-channel transistors 120 and 122 are used as the switch 102. In this embodiment, one plate of the capacitor is connected to the p-channel transistor 120 while the other plate is connected to GROUND. The operation of this embodiment is similar to that of the FIG. 21 embodiment with logic levels for "1" and "0" appropriately reversed and thus a detailed description is omitted.

Figure 23:
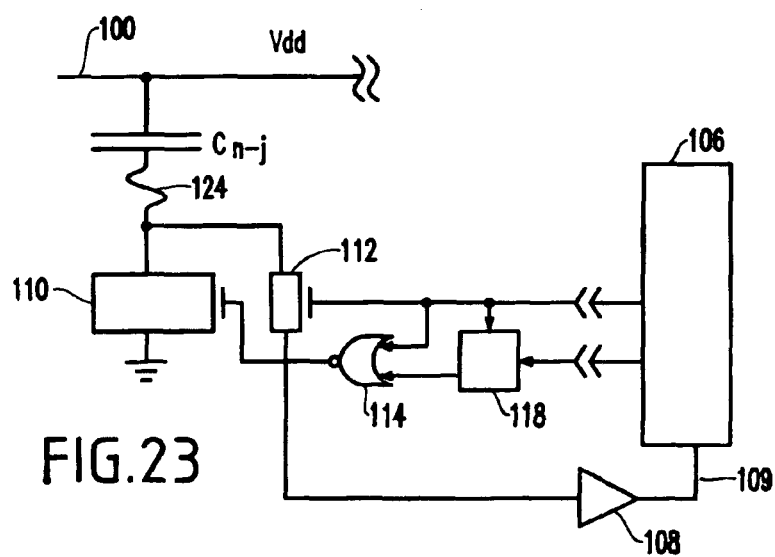
FIG. 23 shows yet another embodiment of a circuit for testing a capacitor structure according to the present invention.

The FIGS. 21 and 22 embodiments may detect and correct for a very wide range of leakage currents in the range of nanoamps and even amps. However, it is possible that the leakage in a respective capacitor segment may be so high as to prevent the effective bring-up of the power supply. If the leakage is so high that the power supply cannot approach its normal operating range, some of the circuits such as 114, 106, 108 may not function properly. Accordingly, FIG. 23 shows another embodiment of the test circuit which can deal with this situation. An on-chip metal fuse 124 is provided in series with the capacitor $C_{n-j}$. This series metal fuse 124 blows instantly when a low resistance short circuit defect occurs. However, the metal fuse 124 may not respond to lower values of leakage currents, such as in the range of milliamp or microamp currents; hence the need for circuits 114, 118, 106, 108 and transistors 110 and 112.

Figure 24A:
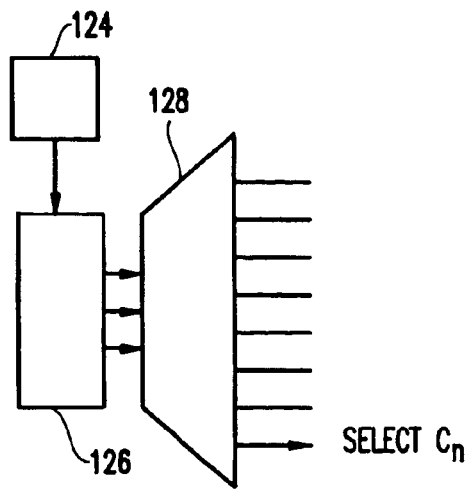
FIGS. 24A–24C show embodiments of different circuits for selecting capacitor structures according to the present invention.
Figure 24B:
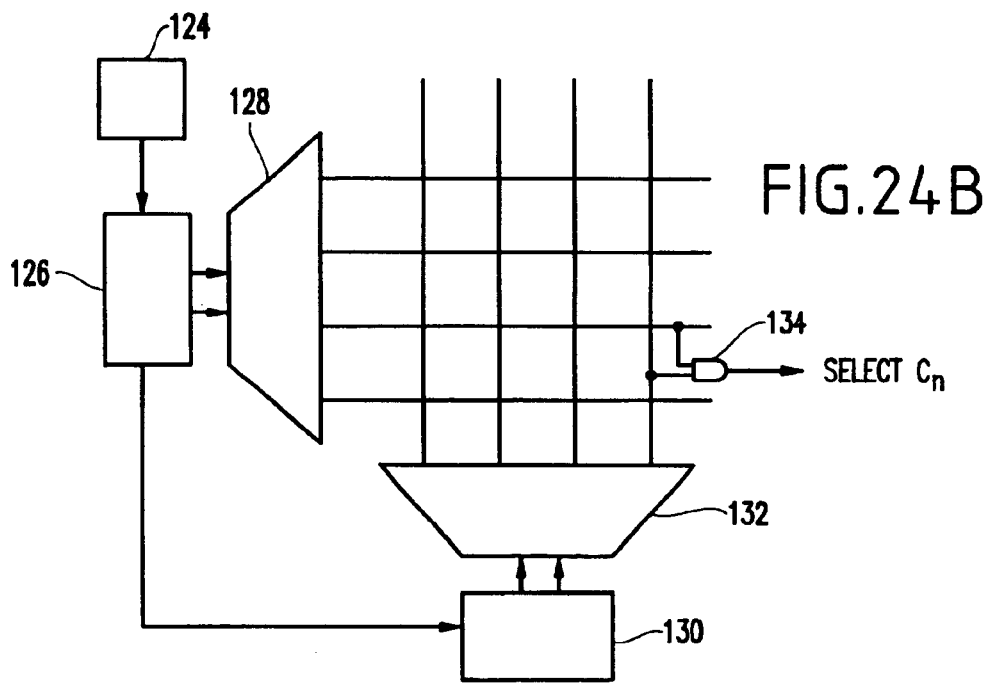
Figure 24C:
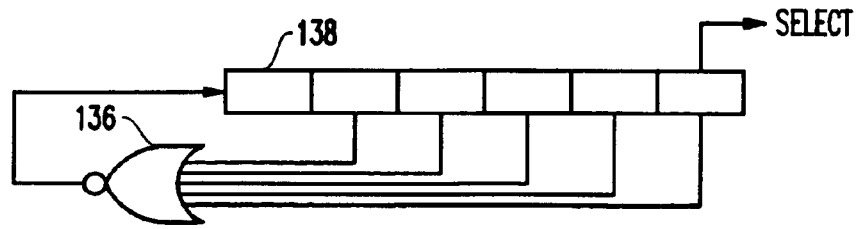

Finally, FIGS. 24A–24C show three alternative circuits for selecting different capacitors for testing (or monitoring) from a bank of capacitors. For example, FIG. 24A shows a low frequency oscillator 124 which drives a counter 126, which in turn drives a decoder 128 in a well known manner. The decoder 128 appropriately selects each of the capacitor segments in binary order for testing before returning to the first capacitor segment.

FIG. 24B shows a two-stage decoding circuit. The operation is quite similar to the FIG. 24A embodiment as it includes the decoder 128, the counter 130 and the decoder 132. Based on the output of decoders 128 and 132, a respective NAND-gate 134 is selected which thereby selects the appropriate capacitor segment for testing.

Finally, FIG. 24C shows a shift register 138 and a NOR gate 136 which work together such that only one binary "1" can stably exist in the shift register 138 to be applied to the capacitor for testing. This single "1" is used to uniquely select one of the capacitor segments.

In a preferred embodiment, the entire capacitor bank may be rechecked approximately ten times per second. However, in applications where low power operation is desired, the control circuit 106 can be programmed to recheck the capacitor bank less often.

In summary, the test circuit operates by testing each capacitor separately preferably on a continuous basis. With reference to FIG. 20, each capacitor is separately monitored and tested using the appropriate switch circuit 102 and the test circuit. After testing a capacitor, such as capacitor $C_{n-j}$, the appropriate switch 102 is placed in either: 1) state B (i.e., normal operation) if the capacitor was working properly; or 2) in state A (i.e., Disconnect) if the capacitor is not operating properly. As discussed above with respect to FIGS. 21 and 22, this may be accomplished using a fuse circuit 118 and NOR gate 114. The select circuit 104 then advances to the next capacitor to perform a similar operation. This repeats throughout the testing cycle so as to disconnect improperly operating capacitors.

Care should be taken such that no fuse to a non-defective capacitor is accidentally blown. For example, in the FIGS. 21–23 embodiments, the control circuit 106 may be designed such that no fuses are actually blown until the test conditions are valid. For instance, the power supply needs to be in its proper range and applied long enough for all the capacitors to have been fully charged. The control circuit 106 should also be designed so that no fuse is actually blown until a capacitor segment fails at least two sequential tests.

The invention has a high yield, even though it is a large area bypass capacitor utilizing exotic dielectrics because it has been made relatively immune to pin hole defects. The capacitor has a long life, by accommodating point defect wear out problems in sustained operation. Finally, the capacitor has a strong recovery potential, by recovering segments which fail under extreme conditions when normal operations resume.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A circuit for monitoring a plurality of capacitor segments, the circuit comprising:
    a charge monitoring circuit coupled to each capacitor segment;
    a coupling circuit for selectively coupling and decoupling one of said capacitor segments from among a plurality of states; and
    a control circuit for sequentially controlling said coupling circuit of each of said capacitor segments so as to disconnect a failed capacitor segment while said other capacitor segments are monitored.

2. The circuit of claim 1, wherein each of said capacitor segments comprises a plurality of plates and wherein said coupling circuit comprises at least one n-channel transistor connected between said control circuit and a plate of said capacitor segment.

3. The circuit of claim 2, further comprising a fuse circuit provided between said capacitor segment and said at least one n-channel transistor.

4. The circuit of claim 1, wherein each of said capacitor segments comprises a plurality of plates and wherein said coupling circuit comprises at least one p-channel transistor connected between said control circuit and a plate of said capacitor segment, the other plate of the capacitor segment being connected to a ground potential.

5. The circuit of claim 4, wherein said coupling circuit further comprises a fuse circuit connected between said control circuit and said at least one p-channel transistor.

6. The circuit of claim 1, wherein said charge monitoring circuit outputs a signal based on an amount of current flowing through said capacitor segment when said coupling segment is in a test state.

7. The circuit of claim 1, wherein said charge monitoring circuit comprises an integrator circuit.

8. The circuit of claim 1, wherein the control circuit controls the coupling circuit such that the capacitor segment is disconnected only after failing at least twice.

9. A circuit for monitoring a plurality of capacitor segments, each capacitor segment comprising a first low dielectric insulator layer, a low resistance conductor formed into at least two interdigitized patterns on a surface of said first low dielectric insulator layer and high dielectric material provided between said two interdigitized patterns, the circuit comprising:
    a charge monitoring circuit coupled to each of said capacitor segments;
    a coupling circuit connected to each of said capacitor segments, said coupling circuit selectively coupling and decoupling each capacitor segment to one of a disabled state, an enabled state and a testing state; and
    a control circuit connected to said coupling circuit, said control circuit controlling said coupling circuit so as to place said coupling circuit of a failed capacitor in the disabled state while monitoring remaining ones of said plurality of capacitor segments.

10. The circuit of claim 9, wherein each of said capacitor segments comprises a plurality of plates and wherein said coupling circuit comprises at least one n-channel transistor connected between said control circuit and a plate of said capacitor segment.

11. The circuit of claim 10, further comprising a fuse circuit provided between said capacitor segment and said at least one n-channel transistor.

12. The circuit of claim 9, wherein each of said capacitor segments comprises a plurality of plates and wherein said coupling circuit comprises at least one p-channel transistor connected between said control circuit and a plate of said capacitor segment, the other plate of said capacitor segment being connected to a ground potential.

13. The circuit of claim 12, wherein the coupling circuit further comprises a fuse circuit connected between said control circuit and said at least one p-channel transistor.

14. The circuit of claim 9, wherein said charge monitoring circuit outputs a signal based on an amount of current flowing through said capacitor segment when said coupling segment is in the testing state.

15. The circuit of claim 9, wherein said charge monitoring circuit comprises an integrator circuit.

16. The circuit of claim 9, wherein the control circuit controls the coupling circuit such that the failed capacitor segment is placed in the disabled state only after failing at least twice in the testing state.

* * * * *